(12) United States Patent
Fukuda et al.

(10) Patent No.: US 8,149,973 B2
(45) Date of Patent: Apr. 3, 2012

(54) CLOCK RECOVERY CIRCUIT

(75) Inventors: Koji Fukuda, Fuchu (JP); Hiroki Yamashita, Hachioji (JP)

(73) Assignee: Hitachi, Ltd., Tokyo (JP)

( * ) Notice: Subject to any disclaimer, the term of this patent is extended or adjusted under 35 U.S.C. 154(b) by 558 days.

(21) Appl. No.: 12/320,573

(22) Filed: Jan. 29, 2009

(65) Prior Publication Data

US 2009/0207957 A1    Aug. 20, 2009

(30) Foreign Application Priority Data

Feb. 19, 2008   (JP) ................. 2008-037088

(51) Int. Cl.
*H04L 7/00* (2006.01)
(52) U.S. Cl. ........ 375/354; 375/327; 375/371; 375/373; 375/376; 329/307
(58) Field of Classification Search .............. 375/327, 375/354, 371–376; 329/307
See application file for complete search history.

(56) References Cited

U.S. PATENT DOCUMENTS

| 4,947,407 | A | * | 8/1990 | Silvian | .......................... | 375/340 |
| 2004/0114632 | A1 | | 6/2004 | Yuuki et al. | | |
| 2007/0286321 | A1 | * | 12/2007 | Gupta et al. | .................. | 375/375 |

FOREIGN PATENT DOCUMENTS

JP     2004-180188    11/2002

OTHER PUBLICATIONS

Masafumi Nogawa et al., "A 10Gb/s Burst-Mode CDR IC in 0.13 μm CMOS", ISSCC 2005 Session 12/Optical Communications/12/5, pp. 228-229, 595.

* cited by examiner

*Primary Examiner* — Curtis Odom
(74) *Attorney, Agent, or Firm* — Stites & Harbison, PLLC; Juan Carlos A. Marquez, Esq.

(57) ABSTRACT

A clock recovery circuit capable of simultaneously satisfying all of a bit synchronization period, a clock wander tracking performance, and a high high-frequency jitter tolerance. The clock recovery circuit includes: a phase difference detecting circuit that detects a phase difference between an input data signal and a recovery clock; an averaging circuit that averages the output of the phase difference detecting circuit; a sampling and holding circuit with resetting that samples and holds the output of the phase difference detecting circuit; and a recovery clock generating circuit that generates a recovery clock having a phase corresponding to the sum of the integral value of the output of the averaging circuit and the output of the sampling and holding circuit with resetting. The sampling and holding circuit with resetting receives a burst transmission start signal and samples and holds the output of the phase difference detecting. In addition, the sampling and holding circuit with resetting receives a burst transmission end signal and resets the held value to an initial value.

8 Claims, 6 Drawing Sheets

101: INPUT DATA SIGNAL
102: RECOVERY CLOCK
106: RECOVERY CLOCK GENERATING CIRCUIT
110: BURST TRANSMISSION START SIGNAL
111: BURST TRANSMISSION END SIGNAL

CLOCK RECOVERY CIRCUIT

CLAIM OF PRIORITY

The present application claims priority from Japanese patent application JP 2008-037088 filed on Feb. 19, 2008, the content of which is hereby incorporated by reference into this application.

FIELD OF THE INVENTION

The present invention relates to a clock recovery circuit and more particularly to a technique for recovering a clock signal from a received data signal.

BACKGROUND OF THE INVENTION

The inventors have examined the following techniques applicable to, for example, a clock recovery circuit.

FIG. 7 is diagram illustrating a PON (passive optical network) system according to the related art. The PON system is constructed by connecting an OLT (optical line terminal) 701 installed in the central office of a communication service provider and ONUs (optical network units) 702-$n$ ($n$ is a natural number) installed at plural user sites using an optical fiber 703 and a coupler 704 that branches the optical fiber.

Data signals are transmitted as a series of burst data signals from each of the ONUs 702-$n$ to the OLT 701. FIG. 8 is a conceptual diagram illustrating upstream data transmission in the PON system. Each of the ONUs 702-$n$ transmits a burst data signal 801-$n$ during a time-division time slot. The burst data signal 801-$n$ includes a preamble 802-$n$ that is the head of the burst data signal detected by the OLT 701 to recover a clock and a payload 803-$n$ that stores communication data of the user. The OLT 701 and the ONUs 702-$n$ have their own internal clock generating sources, and each of the ONUs 702-$n$ transmits a burst signal having a phase synchronized with the phase of its own internal clock. Therefore, the OLT 701 is provided with a clock recovery circuit that recovers a clock having the same phase as the burst data signal from the preamble 802-$n$ whenever receiving the burst data signals 801-$n$ from the ONUs 702-$n$. The period from the time when the clock recovery circuit detects the start of the transmission of burst data to the time when the clock recovery circuit recovers a clock having the same phase as the burst data signal is referred to as a bit synchronization period.

In the OLT having a long bit synchronization period, it is necessary to lengthen the preamble area. When the preamble area is lengthened, in the PON system in which each ONU transmits the burst data signal, the percentage of payload in the overall amount of communication is lowered, and data transmission efficiency is reduced. Therefore, a clock recovery circuit capable of having a short bit synchronization period is needed.

The clock recovery circuit needs to change the phase of a recovery clock signal according to an unavoidable slow change in the clock frequency of an internal clock generating source of the ONU provided at a transmitter side, that is, a change in the phase of the burst data signal caused by a clock wander.

However, there is a fluctuation in a rising edge time and a falling edge time of the waveform of a signal input to the OLT 701, that is, high-frequency jitter in the waveform, due to unavoidable high-frequency jitter of the internal clock generating source of the ONU and waveform distortion depending on a transmission code sequence, which is caused by attenuation characteristics depending on the signal frequency of the optical fiber 703 and the coupler 704. The clock recovery circuit needs to cancel the high-frequency jitter in an input waveform and recover a clock with low jitter. That is, the clock recovery circuit needs to have a high high-frequency jitter tolerance.

As described above, the clock recovery circuit for a burst transmission system, such as a PON system, needs to satisfy three requirements, that is, a short bit synchronization period, a clock wander tracking performance, and a high high-frequency jitter tolerance.

FIG. 9 is a diagram schematically illustrating the structure of a clock recovery circuit disclosed in JP-A-2004-180188. A phase difference detecting circuit 901 detects a phase difference between an input data signal 101 and a recovery clock (internal clock) 102, outputs an EARLY signal 902 when the phase of the recovery clock 102 leads the phase of the input data signal 101, and outputs a LATE signal 903 when the phase of the recovery clock 102 lags the phase of the input data signal 101. An averaging circuit 904 counts the EARLY signal 902 and the LATE signal 903, outputs a DOWN signal 906 when the number of EARLY signals is larger than the number of LATE signals, and outputs an UP signal 905 when the number of EARLY signals is smaller than the number of LATE signals. A clock phase adjusting circuit 907 changes the phase of a reference clock 908 input from the outside and outputs the recovery clock 102. The clock phase adjusting circuit 907 advances the phase of the internal clock when the UP signal 905 is input, and delays the phase of the internal clock when the DOWN signal 906 is input.

The clock recovery circuit disclosed in JP-A-2004-180188 adjusts the phase of the internal clock on the basis of a value obtained by averaging the phase difference between the input data signal 101 and the recovery clock 102 detected by the phase difference detecting circuit 901 using the averaging circuit 904. Therefore, high-frequency jitter included in the input data signal 101 is averaged and canceled, and there appears no high-frequency jitter in the recovery clock 102.

On the other hand, the clock wander with a low frequency included in the input data signal 101 is emphasized by the averaging operation. Therefore, the recovery clock 102 can follow the clock wander of the input data signal 101. In addition, the clock recovery circuit disclosed in JP-A-2004-180188 is not provided with a clock signal generating circuit, and adjusts the phase of the reference clock 908 input from the outside using the clock phase adjusting circuit 907, thereby adjusting the recovery clock 102. Therefore, it is possible to use the reference clock 908 with low jitter to reduce the jitter of the recovery clock. In this way, the clock recovery circuit disclosed in JP-A-2004-180188 satisfies a clock wander tracking performance and a high high-frequency jitter tolerance, among three requirements required for a clock recovery circuit for burst transmission.

However, the clock recovery circuit disclosed in JP-A-2004-180188 adjusts the phase of a clock on the basis of the average result of the phase difference between the input data signal 101 and the recovery clock 102 for a predetermined period of time. Therefore, it requires a long time to synchronize the phase of the input data signal 101 with the phase of the recovery clock 102. As a result, the clock recovery circuit disclosed in JP-A-2004-180188 has a problem in that the bit synchronization period is long.

FIG. 10 is a diagram schematically illustrating the structure of a clock recovery circuit disclosed in Masafumi Nogawa, et al., "A 10 Gb/s Burst-Mode CDR IC in 0.13 μm CMOS)", 2005 IEEE International Solid-State Circuits Conference Digest of Technical Papers, February 2005, pp. 228 and 229. An internal clock generating circuit 1001 adjusts the frequency of a generated clock in response to a control signal 1003 transmitted from an internal clock frequency control circuit 1002. In this case, the internal clock frequency control circuit 1002 appropriately adjusts the control signal 1003 such that the code period of an input data signal 101 is synchronized with the period of a recovery clock 102. An edge detecting circuit 1004 detects a rising edge and a falling edge of the input data signal 101, and outputs an internal clock phase reset signal 1005 at the rising and falling edge timings. The internal clock generating circuit 1001 resets the phase of a generated clock in synchronization with the internal clock phase reset signal 1005. The internal clock generating circuit 1001 is generally formed by connecting even-numbered variable delay logic inverting circuits and one negative AND circuit in a ring shape. It is possible to change the frequency of a generated clock by adjusting the delay time of the variable delay logic inverting circuit. In addition, it is possible to reset the phase of the clock by inputting the internal clock phase reset signal 1005 to the negative AND circuit.

According to the clock recovery circuit disclosed in the above-mentioned paper, the phase of the recovery clock 102 is reset at the edge time of the input data signal 101. Therefore, it is possible to synchronize the phase of the recovery clock 102 with the phase of an input burst signal at the first rising edge from the start of burst transmission. In addition, the phase of the recovery clock is reset at the edge time of the input signal. Therefore, even when there is a clock wander in the input data signal 101, the phase of the recovery clock can follow the phase of the input data signal 101. In this way, the clock recovery circuit disclosed in the above-mentioned paper satisfies a short bit synchronization period and a clock wander tracking performance, among the above-mentioned three requirements required for a clock recovery circuit for burst transmission.

However, the clock recovery circuit disclosed in the above-mentioned paper directly resets the phase of the internal clock generating circuit 1001 at the edge time of the input data signal 101. Therefore, high-frequency jitter included in the input data signal 101 is transferred to the recovery clock. In addition, since the internal clock generating circuit 1001 needs to be provided in the clock recovery circuit, the size or the power consumption of the circuit is restricted, and it is difficult to form a clock generating circuit with low jitter. Therefore, the clock data generating circuit disclosed in the above-mentioned paper has a low high-frequency jitter tolerance.

SUMMARY OF THE INVENTION

As described above, a clock recovery circuit for burst transmission needs to satisfy three requirements, that is, a short bit synchronization period, a clock wander tracking performance, and a high high-frequency jitter tolerance. However, the clock recovery circuit disclosed in JP-A-2004-180188 has a clock wander tracking performance and a high high-frequency jitter tolerance, but has a long bit synchronization period. The clock recovery circuit disclosed in the above-mentioned paper has a short bit synchronization period and a clock wander tracking performance, but has a low high-frequency jitter tolerance.

The invention has been made in order to solve the above-mentioned problems, and an object of the invention is to provide a clock recovery circuit capable of simultaneously satisfying three requirements, required for a clock recovery circuit for burst transmission, that is, a short bit synchronization period, a clock wander tracking performance, and a high high-frequency jitter tolerance.

The above-mentioned object, other objects, and new characteristics of the invention will be apparent from the specification and the accompanying drawings.

The outline of a representative embodiment among the exemplary embodiments of the invention will be described below.

That is, a clock recovery circuit according to the representative embodiment of the invention includes a first feedback path that is used during general data transmission and averages a phase difference between a recovery clock and an input data signal to adjust a clock phase and a second feedback path that is used only at a burst transmission start time and rapidly changes the phase of the recovery clock. In this way, it is possible to simultaneously satisfy requirements required for a clock recovery circuit for burst transmission, that is, a short bit synchronization period, a clock wander tracking performance, and a high high-frequency jitter tolerance.

In the clock recovery circuit according to the representative embodiment, the second feedback path that changes the phase of the recovery clock at a high-speed at the burst transmission start time may be slowly reset during a normal operation. In this way, it is not necessary to reset the second feedback path that changes the phase of an internal clock at a high-speed, and it is possible to shorten the time interval between burst transmission operations.

According to the representative embodiment of the invention, it is possible to provide a clock recovery circuit having a short bit synchronization period, a clock wander tracking performance, and a high jitter tolerance.

DETAILED DESCRIPTION OF THE PREFERRED EMBODIMENTS

Figure 1:
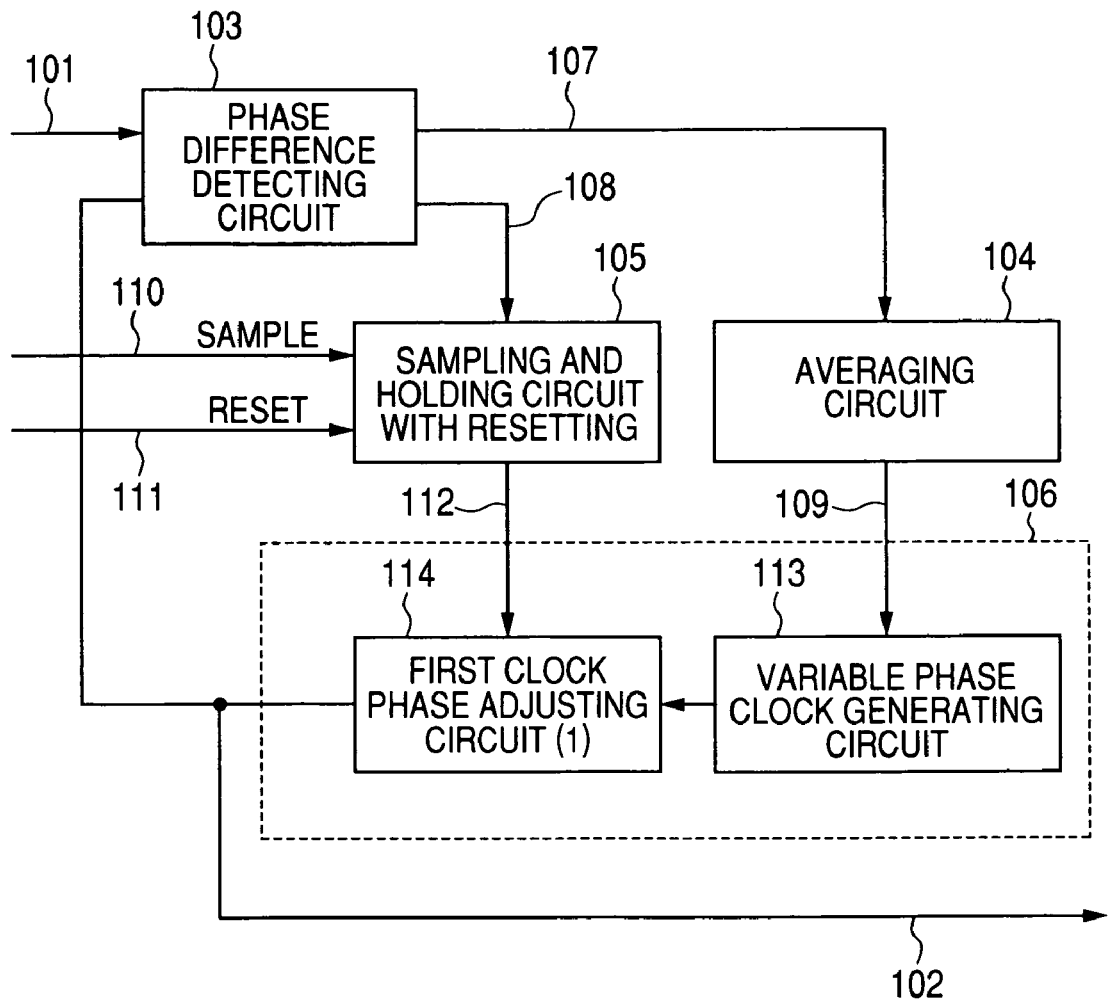
FIG. 1 is a block diagram illustrating an example of the structure of a clock recovery circuit according to a first embodiment of the invention.

Hereinafter, exemplary embodiments of the invention will be described in detail with reference to the accompanying drawings. In the drawings for illustrating the embodiments, the same components are denoted by the same reference numerals, and a repeated description thereof will be omitted. The invention is not limited to the following embodiments.

For convenience of description, the invention is divided into plural sections or embodiments, if necessary. When the sections or embodiments are not particularly specified, they are related with each other. For example, some of the sections or embodiments may be modifications of the other sections or embodiments, and supplement the other sections or embodiments. In addition, in the following embodiments the number of components (including, for example, a number, a numerical value, an amount, and a range) is not limited to a specific value except that it is particularly specified and is clear in principle, but it may be equal to or larger than a predetermined value.

First Embodiment

FIG. 1 is a block diagram illustrating an example of the structure of a clock recovery circuit according to a first embodiment of the invention. The clock recovery circuit according to the first embodiment includes a phase difference detecting circuit 103 (first circuit) that receives an input data signal 101 and outputs a recovery clock 102, an averaging circuit 104 (second circuit), a sampling and holding circuit 105 with resetting (third circuit), and a recovery clock generating circuit 106 (fourth circuit). The recovery clock generating circuit 106 includes a variable phase clock generating circuit 113 (sixth circuit) and a first clock phase adjusting circuit 114 (seventh circuit).

The clock recovery circuit according to the first embodiment is composed of, for example, a semiconductor integrated circuit, and is formed on one semiconductor chip by a known semiconductor manufacturing technique.

The phase difference detecting circuit 103 detects a phase difference between the input data signal 101 and the recovery clock 102, and outputs a low-speed phase difference signal 107 and a high-speed phase difference signal 108. In general, the low-speed phase difference signal 107 and the high-speed phase difference signal 108 are the same signal. However, the low-speed phase difference signal 107 and the high-speed phase difference signal 108 may be different from each other, which will be described below.

The averaging circuit 104 performs an averaging process on the low-speed phase difference signal 107 for a predetermined period and outputs a low-speed clock phase control signal 109. The averaging circuit 104 is generally mounted as a low pass filter for analog or digital processing.

The sampling and holding circuit 105 with resetting samples and hales holds the high-speed phase difference signal 108 in synchronization with a burst transmission start signal 110 input from the outside at a burst transmission start timing, and outputs a high-speed clock phase adjusting signal 112. The sampling and holding circuit 105 with resetting resets the high-speed clock phase adjusting signal 112 to zero, in synchronization with a burst transmission end signal 111 input from the outside at a burst transmission end timing.

The recovery clock generating circuit 106 generates a clock having a phase corresponding to the sum of the integral value of the low-speed clock phase control signal 109 and the high-speed clock phase adjusting signal 112. The recovery clock generating circuit 106 is generally formed by connecting the variable phase clock generating circuit 113 that can change the phase of the previously generated clock by a value designated by the low-speed clock phase control signal 109 to generate the current clock and the first clock phase adjusting circuit 114 that changes the phase of an input clock by a value designated by the high-speed clock phase adjusting signal 112 and outputs it in a cascade manner.

Assuming that the phase is the integral value of a frequency, the variable phase clock generating circuit 113 may generate a clock having a value designated by the low-speed clock phase control signal 109 as a frequency.

The high-speed clock phase adjusting signal 112 has a value that is shorter than the matching period of the input data signal 101 all the time. Therefore, the first clock phase adjusting circuit 114 may be composed of a phase-interpolation-type clock phase adjusting circuit that has no limitation in a phase variable range but has a complicated circuit structure as well as a variable delay circuit that has a simple circuit structure but has a limited phase variable range.

In the clock recovery circuit according to the first embodiment of the invention, at the burst transmission start time, the sampling and holding circuit is operated and the high-speed clock phase adjusting signal 112 varies greatly. Therefore, it is possible to synchronize the phase of the recovery clock 102 with the phase of the input data signal 101 in a short time. During burst transmission, the phase of the recovery clock 102 is not affected by a high-frequency jitter of the input data signal 101 since the high-speed clock phase adjusting signal 112 is maintained constant by the sampling and holding circuit 105 with resetting, but varies depending on the low-speed clock phase control signal 109 averaged by the averaging circuit 104. Therefore, the phase of the recovery clock follows a clock wander in the input data signal 101. At the burst transmission end time, the high-speed clock phase adjusting signal 112 is reset, and the phase of the recovery clock 102 is reset for the next burst transmission start.

As described above, the clock recovery circuit according to the first embodiment of the invention simultaneously satisfies three requirements required for a clock recovery circuit for a burst transmission system, such as a PON system, that is, a short bit synchronization period, a clock wander tracking performance, and a high high-frequency jitter tolerance.

In this embodiment, the burst transmission start signal 110 is input from the outside. However, the burst transmission start signal may be generated by an internal unit that detects a characteristic pattern of the input data signal 101 at the burst transmission start time or an internal unit that sets the time when a phase difference between the input data signal 101 and the recovery clock 102 output from the phase difference detecting circuit 103 is more than a predetermined threshold value as the burst transmission start time.

In this embodiment, the burst transmission end signal 111 is input from the outside. However, the burst transmission end signal may be generated by an internal unit that detects a characteristic pattern of the input data signal 101 at the burst transmission end time.

Further, instead of inserting the first clock phase adjusting circuit 114 into the clock system, the input data signal 101 may vary depending on the high-speed clock phase adjusting signal 112.

Figure 2:
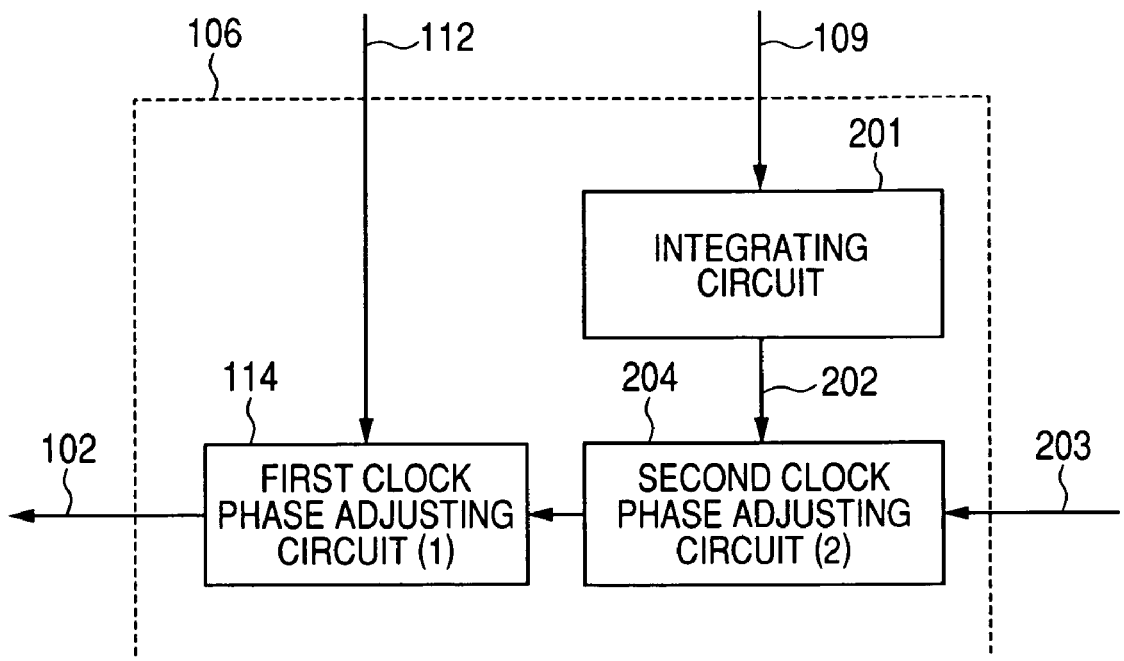
FIG. 2 is a block diagram illustrating an example of the structure of a recovery clock generating circuit of the clock recovery circuit according to the first embodiment of the invention.

FIG. 2 is a block diagram illustrating an example of the structure of a recovery clock generating circuit 106 different from that shown in FIG. 1. The recovery clock generating circuit 106 shown in FIG. 2 changes the phase of a reference clock 203 input from the outside, depending on the low-speed clock phase control signal 109 and the high-speed clock phase adjusting signal 112, and outputs a recovery clock 102. The recovery clock generating circuit 106 includes an integrating circuit 201 that calculates the integral value of the low-speed clock phase control signal 109 and outputs a low-speed clock phase adjusting signal 202, a second clock phase adjusting circuit 204 that changes the phase of the reference clock 203 input from the outside by a value designated by the low-speed clock phase adjusting signal 202 and outputs it, and the first clock phase adjusting circuit 114 that changes the phase of an input clock by a value designated by the high-speed clock phase adjusting signal 112 and outputs it. The phase of the reference clock 203 input from the outside is changed by the second clock phase adjusting circuit 204 and the first clock phase adjusting circuit 114, and the reference clock is output as the recovery clock 102. According to the recovery clock generating circuit 106 shown in FIG. 2, it is not necessary to provide a clock generating circuit in the clock recovery circuit. Therefore, it is possible to use a low-jitter reference clock to generate a low-jitter recovery clock, and improve the high-frequency jitter tolerance of the clock recovery circuit.

Since the period of a clock is 360°, the integrating circuit 201 may be an integrating circuit with a saturated reset function in which the integral value is reset every 360°.

The connection order of the first clock phase adjusting circuit 114 and the second clock phase adjusting circuit 204 is not particularly limited. For example, any of the following structures may be used: a structure that inputs the reference clock 203 to the first clock phase adjusting circuit 114 to change the phase of the reference clock and inputs the changed clock to the second clock phase adjusting circuit 204 to change the phase of the clock, thereby generating the recovery clock 102; and a structure that inputs the reference clock 203 to the second clock phase adjusting circuit 204 to change the phase of the reference clock and inputs the changed clock to the first clock phase adjusting circuit 114 to change the phase of the clock, thereby generating the recovery clock 102.

The high-speed clock phase adjusting signal 112 has a value that is shorter than the matching period of the input data signal 101 all the time. Therefore, the first clock phase adjusting circuit 114 may be composed of a phase-interpolation-type clock phase adjusting circuit that has no limitation in a phase variable range but has a complicated circuit structure as well as a variable delay circuit that has a simple circuit structure but has a limited phase variable range.

Figure 3:
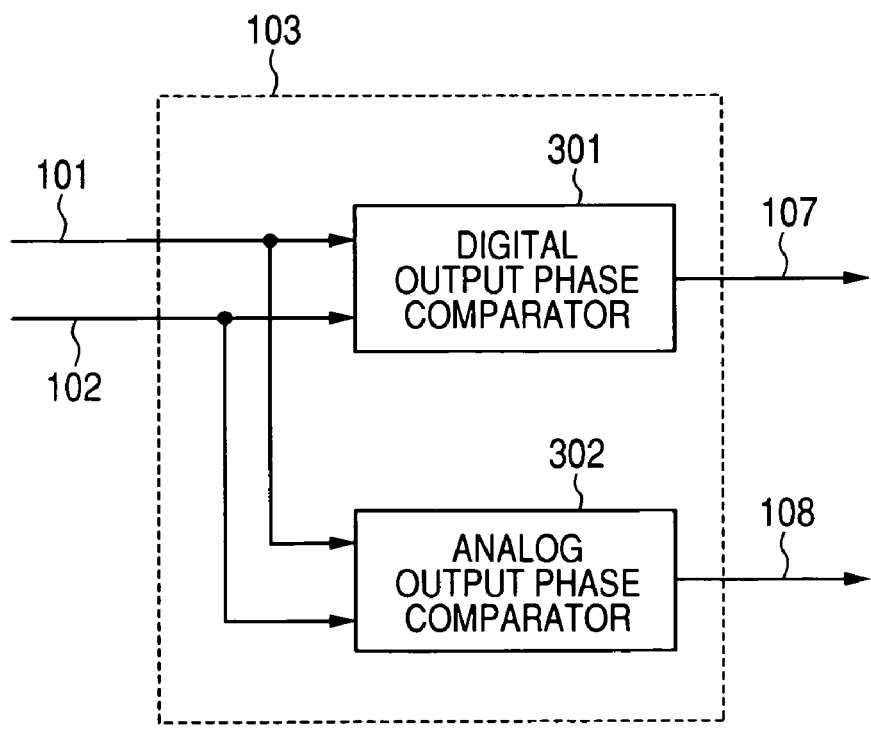
FIG. 3 is a block diagram illustrating an example of the detailed structure of a phase difference detecting circuit of the clock recovery circuit according to the first embodiment of the invention.

FIG. 3 is a block diagram illustrating an example of the structure of the phase difference detecting circuit 103. The phase difference detecting circuit 103 shown in FIG. 3 includes a digital out phase comparator 301 and an analog output phase comparator 302. In general, the digital out phase comparator 301 is a bang-bang output phase comparator that compares the phase of the input data signal 101 with the phase of the recovery clock 102, outputs a value of +1 as the low-speed phase difference signal 107 when the phase of the recovery clock 102 leads the phase of the input data signal 101, and outputs a value of −1 as the low-speed phase difference signal 107 when the phase of the recovery clock 102 lags the phase of the input data signal 101. The digital out phase comparator 301 may be composed of a known circuit, such as a general Alexander-type phase comparing circuit or an eye-tracking-type phase comparing circuit disclosed in JP-A-2004-180188. The low-speed phase difference signal 107 is averaged by the averaging circuit 104 and then input to the recovery clock generating circuit 106. Therefore, the low-speed phase difference signal is little affected by a quantization error caused by the bang-bang output. As in the phase difference detecting circuit 103 shown in FIG. 3, when the low-speed phase difference signal 107 is a digital signal, the averaging circuit 104 shown in FIG. 1 may be composed of a circuit that performs an averaging process using digital processing.

The analog output phase comparator 302 outputs a phase difference between the input data signal 101 and the recovery clock 102 as an analog value. The analog output phase comparator 302 may be composed of a known unit, such as a general Hodge-type phase comparing circuit.

Figure 4:
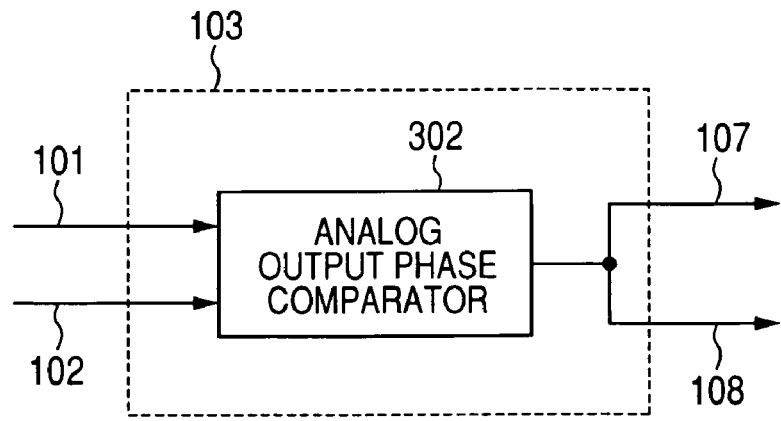
FIG. 4 is a block diagram illustrating another example of the structure of the phase difference detecting circuit of the clock recovery circuit according to the first embodiment of the invention.

FIG. 4 is a block diagram illustrating another example of the structure of the phase difference detecting circuit 103. The phase difference detecting circuit 103 shown in FIG. 4 outputs a signal output from the analog output phase comparator 302 to the low-speed phase difference signal 107 and the high-speed phase difference signal 108. As in the phase difference detecting circuit 103 shown in FIG. 4, when the low-speed phase difference signal 107 is an analog signal, the averaging circuit 104 shown in FIG. 1 may be composed of an analog low pass filter circuit.

Second Embodiment

Figure 5:
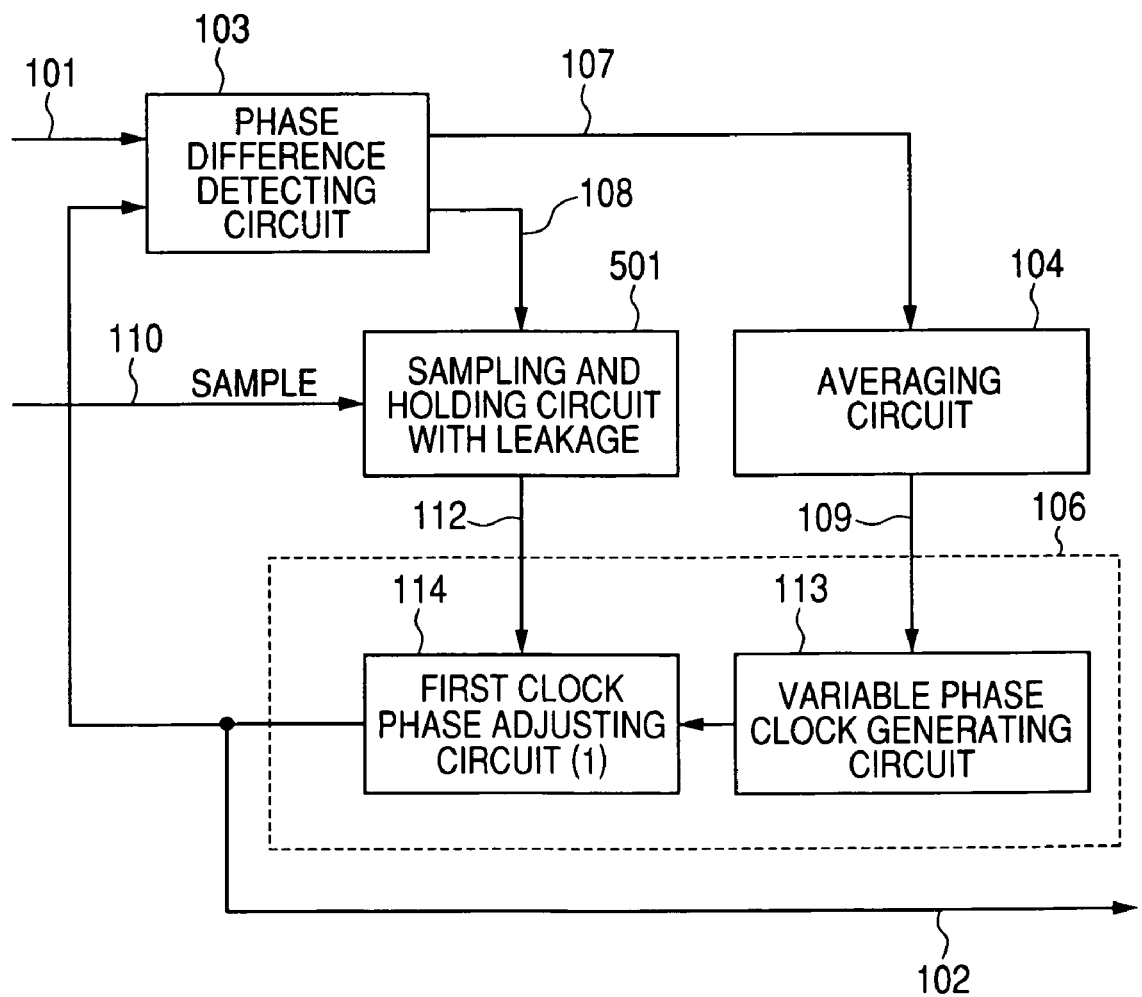
FIG. 5 is a block diagram illustrating an example of the structure of a clock recovery circuit according to a second embodiment of the invention.

FIG. 5 is a block diagram illustrating an example of the structure of a clock recovery circuit according to a second embodiment of the invention. The clock recovery circuit according to the second embodiment is similar to that according to the first embodiment except that the sampling and holding circuit 105 with resetting is substituted for a sampling and holding circuit 501 (fifth circuit) with leakage.

The sampling and holding circuit 501 with leakage samples and holds the high-speed phase difference signal 108 in synchronization with a burst transmission start signal 110 input from the outside at a burst transmission start time, and outputs a high-speed clock phase adjusting signal 112. However, leakage occurs in the holding operation, and the high-speed clock phase adjusting signal 112 is slowly changed to zero, which is an initial value. The change speed of the high-speed clock phase adjusting signal 112 due to the leakage is sufficiently lower than the change speed of the low-speed clock phase control signal 109 output from the averaging circuit 104 (the operation speed of the averaging circuit 104), but is shorter than each burst time width of the input data signal 101.

In the clock recovery circuit according to the second embodiment of the invention, at the burst transmission start time, the sampling and holding circuit 501 with leakage performs a sample and hold operation and the high-speed clock phase adjusting signal 112 varies greatly. Therefore, it is possible to synchronize the phase of the recovery clock 102 with the phase of the input data signal 101 in a short time.

During burst transmission, the phase of the recovery clock 102 is not affected by a high-frequency jitter of the input data signal 101 since the high-speed clock phase adjusting signal 112 is maintained constant by the sampling and holding circuit 501 with leakage. However, the phase of the recovery clock 102 varies depending on the low-speed clock phase control signal 109 averaged by the averaging circuit 104. Therefore, the phase of the recovery clock follows a clock wander in the input data signal 101.

In this case, a change in the phase of the recovery clock 102 due to the slow change of the high-speed clock phase adjusting signal 112 caused by the leak operation of the sampling and holding circuit 501 with leakage is detected as a phase difference between the input data signal 101 and the recovery clock 102 by the phase difference detecting circuit 103, and is absorbed by a change in the low-speed clock phase control signal 109 output from the averaging circuit 104.

As described above, the clock recovery circuit according to the second embodiment of the invention simultaneously satisfies three requirements required for a clock recovery circuit of a burst transmission system, such as a PON system, that is, a short bit synchronization period, a clock wander tracking performance, and a high high-frequency jitter tolerance.

In the clock recovery circuit according to the second embodiment of the invention, the high-speed clock phase adjusting signal 112 has already been reset to zero by the sampling and holding circuit 501 with leakage at each burst transmission end time. Therefore, a reset time required to reset the high-speed clock phase adjusting signal 112 to change the phase of the recovery clock 102 at the burst transmission end time is not needed. As a result, it is possible to reduce the dead time between a burst transmission operation and the next burst transmission operation to improve effective transmission efficiency, or it is possible to remove the dead time to continuously perform burst transmission.

Figure 6:
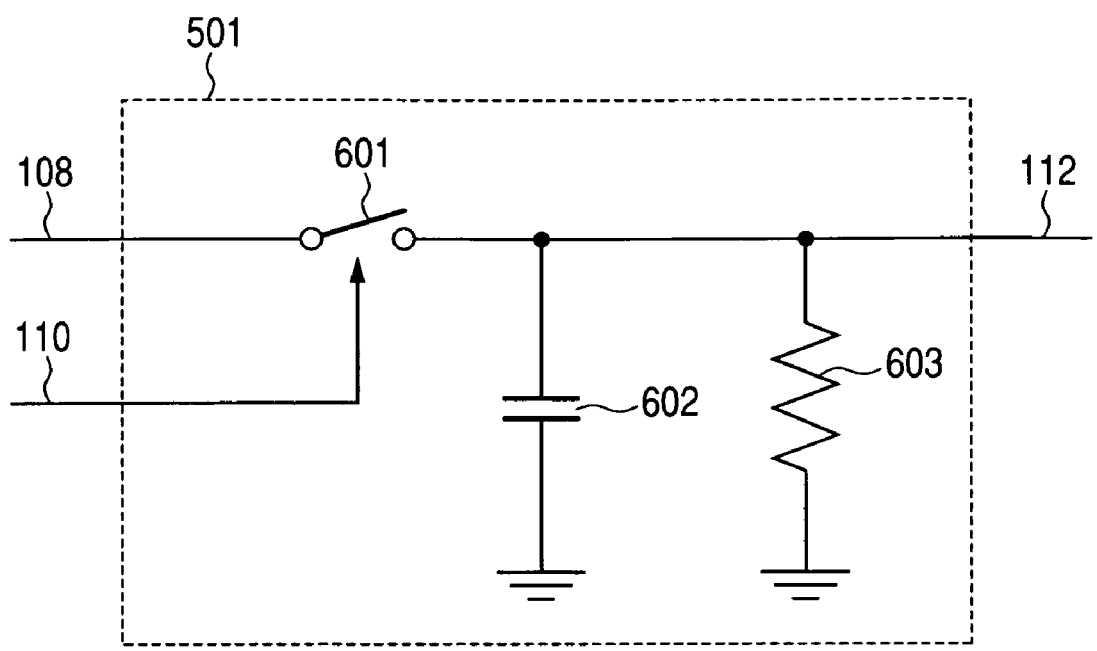
FIG. 6 is a block diagram illustrating an example of the detailed structure of a sampling and holding circuit with leakage of the clock recovery circuit according to the second embodiment of the invention.
Figure 7:
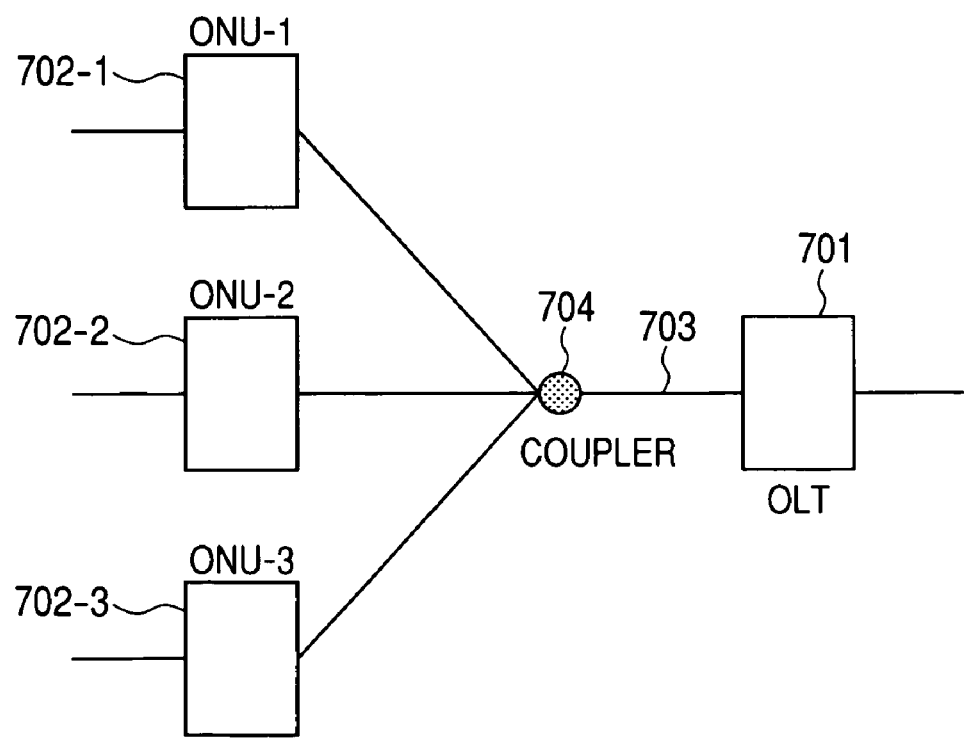
FIG. 7 is a diagram illustrating an example of the structure of a network in a PON system according to the related art.
Figure 8:
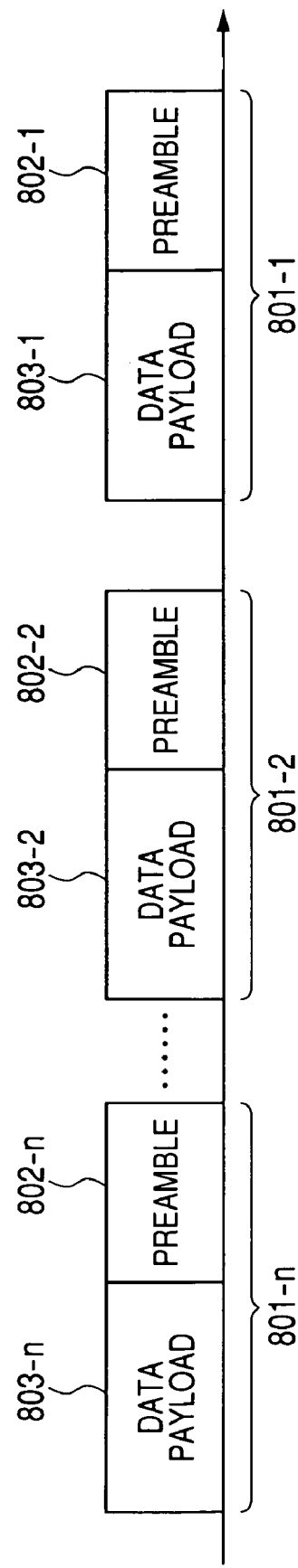
FIG. 8 is a conceptual diagram illustrating upstream data transmission in the PON system according to the related art.
Figure 9:
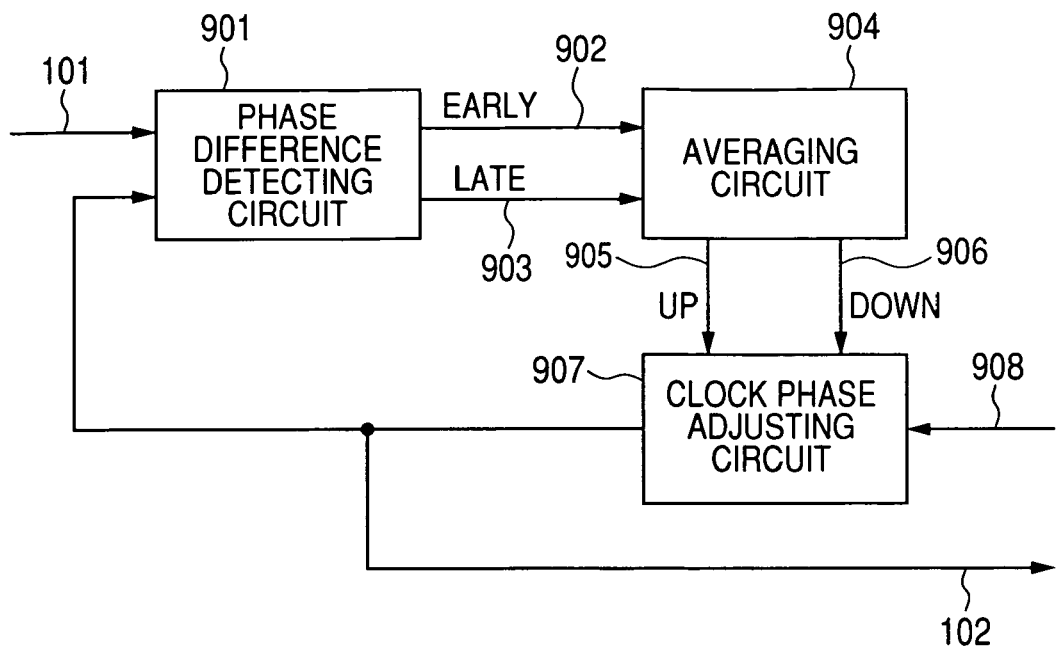
FIG. 9 is a block diagram illustrating an example of the structure of a clock recovery circuit according to the related art.
Figure 10:
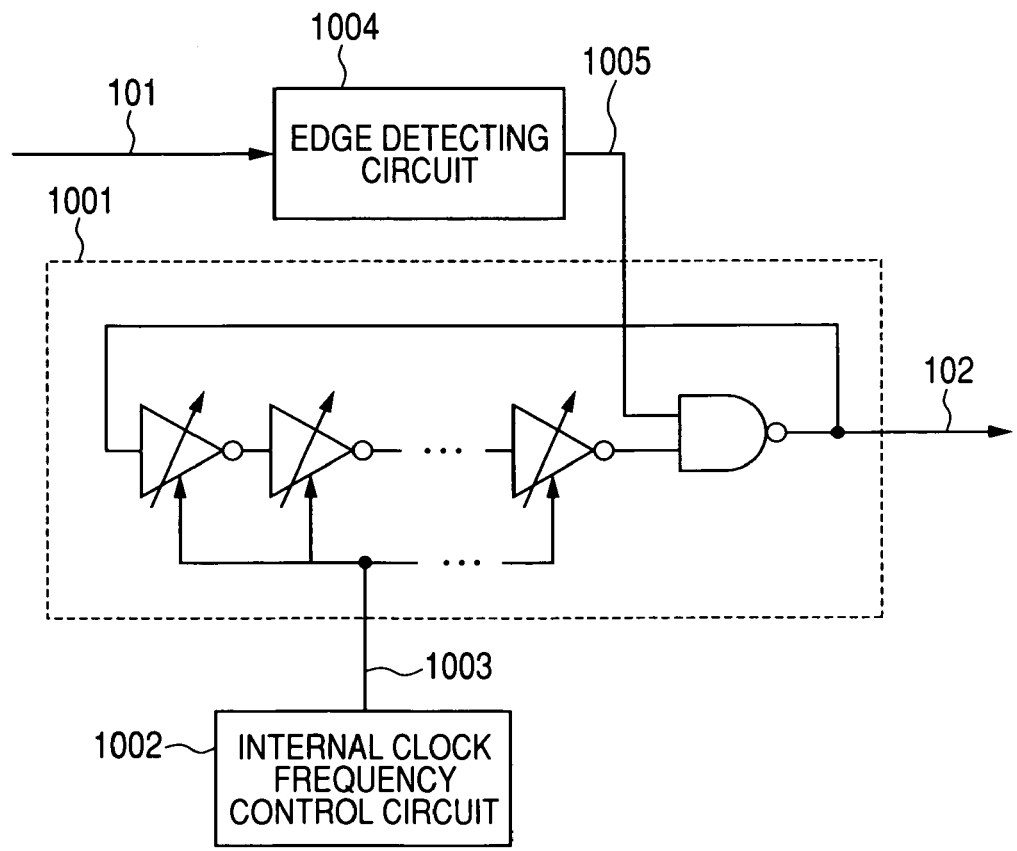
FIG. 10 is a block diagram illustrating another example of the clock recovery circuit according to the related art.

FIG. 6 is a circuit diagram illustrating an example of the structure of the sampling and holding circuit 501 with leakage. The sampling and holding circuit 501 with leakage shown in FIG. 6 receives the high-speed phase difference signal 108 as a voltage value, and outputs the high-speed clock phase adjusting signal 112 as a voltage value. The sampling and holding circuit 501 with leakage includes a switch 601, a capacitor 602, and a resistor 603. The switch 601 performs switching between the high-speed phase difference signal 108 and an output. The capacitor 602 and the resistor 603 are connected in parallel between the output and the ground.

The switch 601 is turned on to make a voltage between both terminals of the capacitor 602, that is, the level of the high-speed clock phase adjusting signal 112 equal to that of the high-speed phase difference signal 108 for the period for which the burst transmission start signal 110, which is a pulse signal with a short time width, is turned on. Then, when the burst transmission start signal 110 is turned off, the switch 601 is turned off, and the voltage of the high-speed clock phase adjusting signal 112 is maintained by the capacitor 602. Then, charge stored in the capacitor 602 is discharged through the resistor 603, and the voltage of the high-speed clock phase adjusting signal 112 is slowly changed to zero.

According to the sampling and holding circuit 501 with leakage shown in FIG. 6, it is possible to set the change speed of the high-speed clock phase adjusting signal 112 to be sufficiently lower than that of the low-speed clock phase control signal 109 output from the averaging circuit 104 and to be shorter than a burst transmission time by appropriately adjusting the sizes of the capacitor 602 and the resistor 603.

In the sampling and holding circuit 501 with leakage shown in FIG. 6, the capacitor 602 and the resistor 603 are shown in the circuit diagram. However, a general sampling and holding circuit having a parasitic capacitor and a parasitic resistor, which are unavoidable components of the circuit, may be used as the sampling and holding circuit with leakage.

Although the exemplary embodiments of the invention have been described above, the invention is not limited thereto, but various modifications and changes of the invention can be made without departing from the scope and spirit of the invention.

The invention relates to a data transmission circuit using a communication interface and a high-speed serial interface, and can be widely applied to all transmission systems required to recover a clock that overlaps input data during burst transmission.

What is claimed is:

1. A clock recovery circuit for generating a recovery clock from an input data signal, comprising:
   a first circuit that detects a phase difference between the input data signal and the recovery clock and outputs the phase difference;
   a second circuit that averages the output of the first circuit and outputs the average;
   a third circuit that samples and holds the output of the first circuit and outputs the held value; and
   a fourth circuit that generates a clock having a phase corresponding to the sum of the integral value of the output of the second circuit and the output of the third circuit and outputs the clock as the recovery clock,
   wherein the third circuit receives a burst transmission start signal, samples and holds the output of the first circuit, and outputs the held value, and
   wherein the third circuit receives a burst transmission end signal, and resets the held value to an initial value.

2. A clock recovery circuit for generating a recovery clock from an input data signal, comprising:
   a first circuit that detects a phase difference between the input data signal and the recovery clock and outputs the phase difference;
   a second circuit that averages the output of the first circuit and outputs the average;
   a third circuit that samples and holds the output of the first circuit and outputs the held value; and
   a fourth circuit that generates a clock having a phase corresponding to the sum of the integral value of the output of the second circuit and the output of the third circuit and outputs the clock as the recovery clock,
   wherein the third circuit receives a burst transmission start signal, samples and holds the output of the first circuit, and outputs the held value, and
   wherein the held value is changed to an initial value.

3. The clock recovery circuit according to claim 2, wherein the third circuit includes:
   a switch that performs switching between the output of the first circuit and the output of the third circuit; and
   a capacitor and a resistor that are connected in parallel between the output of the third circuit and the ground, and
   wherein the switch is turned on in response to the burst transmission start signal.

4. The clock recovery circuit according to claim 2, wherein the change speed of the held value to the initial value by the third circuit is lower than the operation speed of the second circuit, and is shorter than each burst time width of the input data signal.

5. The clock recovery circuit according to claim 1, wherein the fourth circuit includes:
   a fifth circuit that generates a clock having a phase corresponding to the integral value of the second circuit; and
   a sixth circuit that changes the phase of an input clock by a value corresponding to the output of the third circuit or the fifth circuit, and
   wherein the fifth circuit and the sixth circuit are connected to each other in a cascade manner.

6. The clock recovery circuit according to claim 5, wherein the fifth circuit generates a clock having a frequency corresponding to the output of the second circuit.

7. The clock recovery circuit according to claim 5, wherein the fifth circuit changes the phase of a clock supplied from the outside by a value corresponding to the integral value of the second circuit and outputs the changed clock.

8. The clock recovery circuit according to claim 5, wherein the sixth circuit is a variable delay circuit that delays the phase of an input clock by a value corresponding to the output of the third circuit or the fifth circuit.

\* \* \* \* \*